US012575024B1

(12) United States Patent
Ahmed et al.

(10) Patent No.: US 12,575,024 B1
(45) Date of Patent: Mar. 10, 2026

(54) APPARATUS, SYSTEM, AND METHOD FOR REINFORCING SOLDER JOINTS BY BRACING CORNERS OF INTEGRATED CIRCUIT SUBSTRATES

(71) Applicant: Juniper Networks, Inc., Sunnyvale, CA (US)

(72) Inventors: Omar Ahmed, Richmond Hill (CA); Peng Su, San Jose, CA (US); Bernard Glasauer, Saratoga, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 98 days.

(21) Appl. No.: 18/362,903

(22) Filed: Jul. 31, 2023

(51) Int. Cl.
　　*H05K 1/02* 　　　(2006.01)
　　*H05K 3/3494* 　　(2026.01)

(52) U.S. Cl.
　　CPC ......... *H05K 1/0271* (2013.01); *H05K 3/3494* (2013.01); *H05K 2201/2009* (2013.01); *H05K 2203/1581* (2013.01)

(58) Field of Classification Search
　　CPC ......... H05K 1/0271; H05K 2201/2009; H05K 2201/2018; H05K 2201/2045; H05K 2201/10424; H05K 2201/09145; H05K 2201/09136; H05K 2201/10439; H05K 2201/10606
　　USPC ....................................................... 174/255
　　See application file for complete search history.

(56) References Cited

U.S. PATENT DOCUMENTS

| | | | |
|---|---|---|---|
| 6,646,356 B1 * | 11/2003 | Whalen .................. | H01L 23/32 257/784 |
| 8,810,025 B2 * | 8/2014 | Liu ....................... | H01L 23/562 257/702 |
| 2009/0134529 A1 * | 5/2009 | Ishii ..................... | H05K 3/305 257/E23.141 |

* cited by examiner

*Primary Examiner* — Stanley Tso
*Assistant Examiner* — Sidi M Maiga
(74) *Attorney, Agent, or Firm* — Greenberg Traurig, LLP

(57) ABSTRACT

An apparatus may reinforce solder joints by bracing corners of integrated circuit substrates. To do so, an exemplary apparatus may include (1) a substrate of an integrated circuit coupled to a circuit board and (2) at least one corner reinforcement brace coupled to the circuit board and at least one corner of the substrate. Various other apparatuses, systems, and methods are also disclosed.

14 Claims, 9 Drawing Sheets

Apparatus
100

Substrate
102

Corner Reinforcement Brace
104(1)

Corner Reinforcement Brace
104(2)

Integrated Circuit
108

Corner Reinforcement Brace
104(4)

Die
110

Corner Reinforcement Brace
104(3)

Corner Reinforcement Brace 104(2)

Corner Reinforcement Brace 104(3)

Substrate 102

Corner Reinforcement Brace 104(1)

Die 110

Integrated Circuit 108

Corner Reinforcement Brace 104(4)

Apparatus 100

Corner Reinforcement Brace 104(2)

Corner Reinforcement Brace 104(1)

Corner Reinforcement Brace 104(3)

Corner Reinforcement Brace 104(4)

Adhesive 304

Adhesive 304

Adhesive 304

Adhesive 304

Substrate 102

Circuit Board 204

System 300

Circuit Board
204

Corner Reinforcement
Brace
104(3)

Stiffener
402

Die
110

Corner Reinforcement
Brace
104(1)

Corner Reinforcement
Brace
104(4)

System
500

Circuit Board 204

Adhesive 304

Corner Reinforcement Brace 104(3)

Attachment Layer 602

Substrate 102

Stiffener 402

Implementation 600

900

APPARATUS, SYSTEM, AND METHOD FOR REINFORCING SOLDER JOINTS BY BRACING CORNERS OF INTEGRATED CIRCUIT SUBSTRATES

BACKGROUND

Integrated circuits attached to electronic substrates are often soldered to circuit boards by way of a process known as reflow soldering. For example, prior to initiating a reflow process, solder paste may be dispensed on contact pads located on a circuit board, and then integrated circuit substrates may be placed on top of the solder paste, which holds the substrate in position atop the circuit board. After the substrate of the integrated circuits, containing the solder balls, have been put in place, the circuit board may undergo a reflow process that heats the solder balls and solder paste to a certain temperature. The temperature must be hot enough to melt the solder balls and the solder paste such that, once cooled off, the solder balls and paste become a solder joint and acts as the permanent mechanical and electrical connections between the integrated circuits substrate and their corresponding circuit board.

In some examples, integrated circuits with large substrate sizes, especially those of lidless construction, may experience a significant fatigue life reliability degradation after the reflow process, during testing, or during operation. This is due to the coefficient of thermal expansion (CTE) mismatch between the substrate of the integrated circuits and the circuit boards. In addition to the CTE mismatch, an electronic equipment manufacturer may elect to apply a heatsink atop an application-specific integrated circuit (ASIC) after the reflow process to assist in the heat dissipation that is needed to cool the high-powered ASICs during operation. The pressure and/or weight of the heatsink may significantly increase the stress and/or strain imposed on the solder joints formed between the substrate and circuit board. As a result, the solder joints may be liable to break and/or fail over time due to fatigue damage, thereby impairing the functionality or operability of the ASIC and/or shortening the overall lifespan of the underlying device.

The instant disclosure, therefore, identifies and addresses a need for additional apparatuses, systems, and methods for reinforcing solder joints formed between certain integrated circuits and circuit boards.

SUMMARY

As will be described in greater detail below, the instant disclosure generally relates to apparatuses, systems, and methods for reinforcing solder joints by bracing corners of integrated circuit substrates. In one example, an apparatus for accomplishing such a task may include (1) a substrate of an integrated circuit coupled to a circuit board and (2) at least one corner reinforcement brace coupled to the circuit board and at least one corner of the substrate.

Similarly, a method for reinforcing solder joints by bracing corners of integrated circuit substrates may include (1) placing, atop a circuit board, at least one corner reinforcement brace proximate to at least one corner of a substrate of an integrated circuit, (2) fixing the corner reinforcement brace to the circuit board proximate to the corner of the substrate, and (3) adhering the corner of the substrate, the circuit board, and the corner reinforcement brace to one another to strengthen one or more solder joints formed between the substrate and the circuit board.

A system may include (1) a circuit board, (2) a substrate of an integrated circuit coupled to the circuit board, and (3) a plurality of reinforcement braces that are coupled to the circuit board and a plurality of corners of the substrate.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
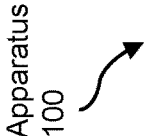
FIG. 1 is an illustration of an exemplary apparatus for reinforcing solder joints by bracing corners of an integrated circuit substrate according to one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for reinforcing solder joints by bracing corners of integrated circuit substrates. As will be explained in greater detail below, embodiments of the instant disclosure may involve placing, atop a circuit board, corner reinforcement braces proximate to the corners of a substrate of an integrated circuit. Such embodiments may also involve fixing the corner reinforcement braces to the circuit board proximate to the corners of the substrate. For example, the corner reinforcement braces may be soldered in place next to the corners of the substrate during a reflow process.

Such embodiments may further involve adhering the corners and/or sides of the substrate, the corner reinforcement braces, and the circuit board to one another to strengthen the solder joints formed between the substrate and the circuit board. For example, gaps between the corner reinforcement braces may be filled with an adhesive (e.g., an epoxy). By doing so, these embodiments may alleviate and/or mitigate the burden and/or weight of a heatsink applied atop the integrated circuit. Specifically, these embodiments may reduce and/or decrease the stress and/or strain imposed on the solder joints between the substrate and the corresponding contact pads on the circuit board by the heatsink. Additionally or alternatively, these embodiments may provide mitigation against solder joint fatigue even when no heatsink is included in the design. As a result, the solder joints may be less liable to break and/or fail over time, thereby prolonging the functionality or operability of the integrated circuit and/or extending the overall lifespan of the underlying device.

The following will provide, with reference to FIGS. 1-8, examples of apparatuses, components, systems, and/or corresponding implementations that facilitate reinforcing solder joints by bracing corners of integrated circuit substrates. In addition, the following will provide, with reference to FIG. 9, examples of methods for reinforcing solder joints by bracing corners of integrated circuit substrates.

FIG. 1 shows an exemplary apparatus 100 for reinforcing solder joints by bracing corners of integrated circuit substrates. As illustrated in FIG. 1, apparatus 100 may include and/or represent a substrate 102 of an integrated circuit 108 and one or more corner reinforcement braces. For example, apparatus 100 may include and/or represent corner reinforcement braces 104(1), 104(2), 104(3), and 104(4) configured, designed, and/or arranged for coupling to a circuit board and the corners and/or sides of substrate 102. In one example, integrated circuit 108 may include and/or represent one or more dies that are physically and/or electrically coupled or connected to substrate 102. For example, integrated circuit 108 may include and/or represent a die 110 that contain and/or incorporate circuitry for performing certain functions and/or operations in connection with an underlying device (not necessarily illustrated in FIG. 1).

In some examples, integrated circuit 108 may include and/or represent any type or form of circuitry packaged as a single unit. In one example, integrated circuit 108 may include and/or represent one or more semiconductor devices and/or components implemented or deployed as part of a computing system. For example, integrated circuit 108 may include and/or represent an ASIC implemented and/or deployed as part of a network device (e.g., a router or switch). Additional examples of integrated circuit 108 include, without limitation, systems on a chip (SoCs), field-programmable gate arrays (FPGAs), central processing units (CPUs), microprocessors, microcontrollers, portions of one or more of the same, variations or combinations of one or more of the same, and/or any other suitable integrated circuits.

In some examples, substrate 102 may include and/or represent a wafer of semiconductor materials (such as silicon, germanium, and/or gallium arsenide). In other examples, substrate 102 may include and/or represent a wafer of electrical insulator materials (such as silicon dioxide, sapphire, aluminum oxide, polymers, and/or ceramics). In one example, substrate 102 may include and/or represent multiple layers of insulation materials. Additionally or alternatively, substrate 102 may include and/or represent conductive traces and/or through-silicon vias that route the signals from the die(s) to the connection terminals and/or leads on the bottom of the package of integrated circuit 108.

In some examples, die 110 may include and/or represent a small, diced piece of semiconductor material. In one example, die 110 may include and/or contain one or more circuits that consist of various electrical and/or electronic components (such as resistors, capacitors, and/or transistors). In this example, such circuits may be etched into die 110.

Although illustrated as a single unit in FIG. 1, die 110 may alternatively constitute and/or represent multiple dies attached and/or mounted to substrate 102. In one example, all the dies may be located and/or positioned within a stiffener applied to the perimeter of one surface (e.g., a top or bottom surface) of substrate 102. In another example, the dies may be stacked together (using, e.g., a "through-silicon vias" technique) and then attached to substrate 102 as a stack. In a further example, a silicon interposer may be attached to substrate 102 first, after which die 110 and/or other components may be attached to the silicon interposer (in, e.g., a "2.5D" package).

In some examples, corner reinforcement braces 104(1)-(4) may each include and/or represent any type or form of physical material, structure, and/or support feature that fastens, couples, and/or adheres to a surface of a substrate. Corner reinforcement braces 104(1)-(4) may take and/or form any suitable shape. In certain implementations, corner reinforcement braces 104(1)-(4) may be shaped and/or designed to contour, follow, and/or abut the corners and/or sides of substrate 102. For example, corner reinforcement braces 104(1)-(4) may each constitute and/or represent a right angle and/or orthogonal structure. In one example, corner reinforcement braces 104(1)-(4) may each include and/or represent an L-shaped brace dimensioned to contour a corner of substrate 102. Additionally or alternatively, corner reinforcement braces 104(1)-(4) may each include and/or represent two segments or pieces that join one another at a right angle.

In other examples, although not necessarily illustrated in this way in FIG. 1, a single ring may surround and/or encompass substrate 102. In one example, this ring may contain and/or incorporate braces that reinforce and/or fortify the corners and/or sides of substrate 102. In other words, corner reinforcement braces 104(1)-(4) may be connected together to form a single ring that surrounds and/or encompasses substrate 102.

In some examples, corner reinforcement braces 104(1)-(4) may be of any suitable dimensions for a given design. In one example, corner reinforcement braces 104(1)-(4) may each measure and/or span a total of approximately five (5) millimeters. For example, corner reinforcement brace 104(1) may measure and/or extend approximately two point five (2.5) millimeters in first direction (e.g., in the x-direction) and may measure and/or extend approximately two point five (2.5) millimeters in second direction (e.g., in the y-direction) that is orthogonal and/or perpendicular to the first direction. In another example, corner reinforcement braces 104(1)-(4) may each measure and/or span a total of approximately fifty (50) millimeters. For example, corner reinforcement brace 104(1) may measure and/or extend twenty-five (25) millimeters in first direction (e.g., in the x-direction) and may measure and/or extend twenty-five (25) millimeters in second direction (e.g., in the y-direction) that is orthogonal and/or perpendicular to the first direction.

In some examples, the heights of corner reinforcement braces 104(1)-(4) may exceed and/or surpass the height of substrate 102. In other examples, the height of substrate 102 may exceed and/or surpass the heights of corner reinforcement braces 104(1)-(4).

Corner reinforcement braces 104(1)-(4) may include and/or contain any of a variety of different materials. In some examples, corner reinforcement braces 104(1)-(4) may each include and/or contain one or more solderable metals. For example, corner reinforcement braces 104(1)-(4) may each include and/or contain copper material. Additional examples of such materials include, without limitation, plastics, ceramics, polymers, metals, composites, combinations or variations of one or more of the same, and/or any other suitable materials.

In some examples, corner reinforcement braces 104(1)-(4) may provide and/or offer structural support, tension, and/or integrity to substrate 102 and/or integrated circuit 108. In one example, corner reinforcement braces 104(1)-(4) may strengthen the solder joints formed between substrate 102 and the circuit board. For example, gaps between corner reinforcement braces 104(1)-(4) may be filled with adhesive material (e.g., an epoxy). Additionally or alternatively, gaps between the edge of substrate 102 and corner reinforcement braces 104(1)-(4) may span and/or extend any suitable distance (e.g., 0.5 millimeters) depending on certain design factors (e.g., the size and/or height of the corner reinforcement braces, the viscosity of the epoxy, etc.).

In some examples, when coupled to substrate 102 and the circuit board by the adhesive, corner reinforcement braces 104(1)-(4) may effectively alleviate and/or mitigate the burden and/or weight of a heatsink applied atop integrated circuit 108. Specifically, corner reinforcement braces 104(1)-(4) may reduce and/or decrease the stress and/or strain imposed on the solder joints between substrate 102 and the corresponding contact pads on the circuit board. As a result, the solder joints may be less liable to break and/or fail over time, thereby prolonging the functionality or operability of integrated circuit 108 and/or extending the overall lifespan of the underlying device. In one example, the apparatuses, systems, and methods disclosed herein may also work if no heatsink is ever applied atop integrated circuit 108.

Figure 2:
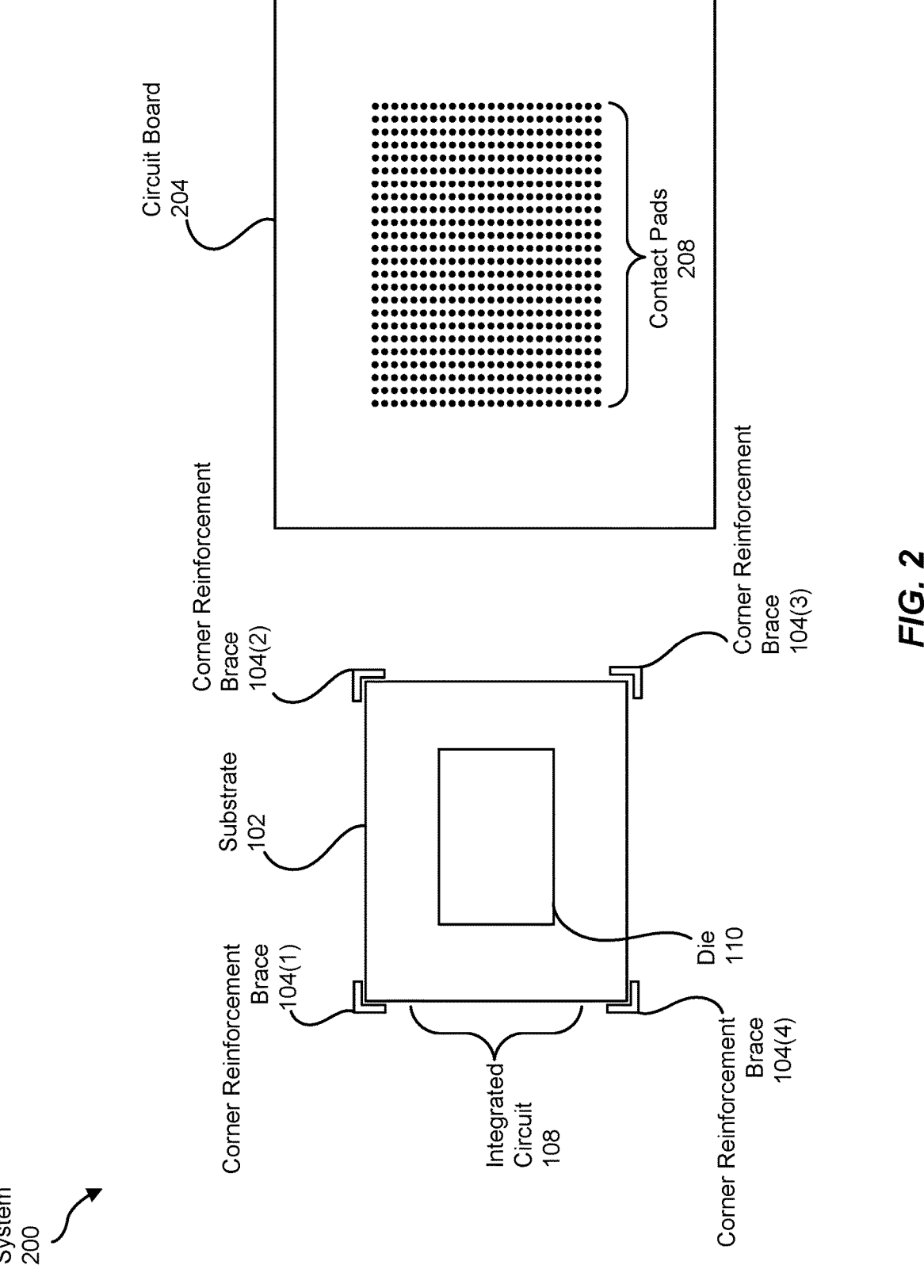
FIG. 2 is an illustration of an exemplary system for reinforcing solder joints by bracing corners of an integrated circuit substrate according to one or more embodiments of this disclosure.

FIG. 2 illustrates an exemplary system 200 for reinforcing solder joints by bracing corners of integrated circuit substrates. In some examples, system 200 may include and/or represent certain components, devices, configurations, and/or features that perform and/or provide functionalities that are similar and/or identical to those described above in connection with FIG. 1. As illustrated in FIG. 2, exemplary system 200 may include and/or represent integrated circuit 108, corner reinforcement braces 104(1)-(4), and a circuit board 204. In one example, integrated circuit 108 may include and/or represent die 110 mounted on and/or coupled to substrate 102. Additionally or alternatively, circuit board 204 may include and/or represent contact pads 208 to which integrated circuit 108 is soldered and/or electrically coupled.

In one example, circuit board 204 may include and/or represent a wafer of semiconductor materials (such as silicon, germanium, and/or gallium arsenide). In another example, circuit board 204 may include and/or represent a wafer of electrical insulator materials (such as silicon dioxide, sapphire, aluminum oxide, polymers, and/or ceramics). Circuit board 204 may include and/or represent multiple layers of insulation materials. Circuit board 204 may also include conductive traces and/or through-silicon vias that route the signals from the silicon to the connection terminals and/or leads on the bottom of the package of integrated circuit 108. Although not necessarily illustrated and/or labelled in this way in FIG. 2, circuit board 204 may include and/or represent one or more additional components, devices, and/or features that form part of one or more circuits incorporated in system 200. In one example, circuit board 204 may include and/or represent one or more solder or adhesive pads to which corner reinforcement braces 104(1)-(4) are soldered, coupled, attached, and/or fixed proximate to the corresponding corners and/or sides of substrate 102.

In some examples, corner reinforcement braces 104(1)-(4) may impede, mitigate, and/or prevent integrated circuit 108 and/or circuit board 204 from warping and/or experiencing extensive CTE mismatch after the reflow process and/or during operation. For example, corner reinforcement braces 104(1)-(4) may mitigate warpage of integrated circuit 108 and/or circuit board 204 or movement of substrate 102 relative to circuit board 204 such that all connection terminals and/or leads on integrated circuit 108 are properly soldered to contact pads 208 on circuit board 204. This mitigation of warpage and/or CTE mismatch induced strain may ensure that all connection terminals and/or leads on integrated circuit 108 are electrically and/or communicatively coupled to contact pads 208 on circuit board 204. In other words, none of the solder joints and/or points between the connection terminals and/or leads on integrated circuit 108 and contact pads 208 on circuit board 204 may suffer damage that disturbs and/or harms the circuit board's electrical, mechanical, and/or communicative integrity.

Figure 3:
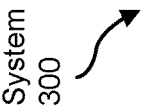
FIG. 3 is an illustration of an exemplary system for reinforcing solder joints by bracing corners of an integrated circuit substrate according to one or more embodiments of this disclosure.

FIG. 3 illustrates a top-down view of an exemplary system 300 for reinforcing solder joints by bracing corners of integrated circuit substrates. In some examples, system 300 may include and/or represent certain components, devices, configurations, and/or features that perform and/or provide functionalities that are similar and/or identical to those described above in connection with either FIG. 1 or FIG. 2. As illustrated in FIG. 3, exemplary system 300 may include and/or represent integrated circuit 108, corner reinforcement braces 104(1)-(4), and circuit board 204. In one example, substrate 102 of integrated circuit 108 may be soldered, electrically coupled, and/or mounted to a surface of circuit board 204. In this example, an adhesive 304 may fill the gaps between corner reinforcement braces 104(1)-(4) and the corresponding corners and/or sides of substrate 102.

In some examples, adhesive 304 may be applied and/or disposed between corner reinforcement braces 104(1)-(4) and the corners and/or sides of substrate 102. Examples of adhesive 304 include, without limitation, epoxies, glues, silicones, combinations or variations of one or more of the same, and/or any other suitable adhesives.

Figure 4:
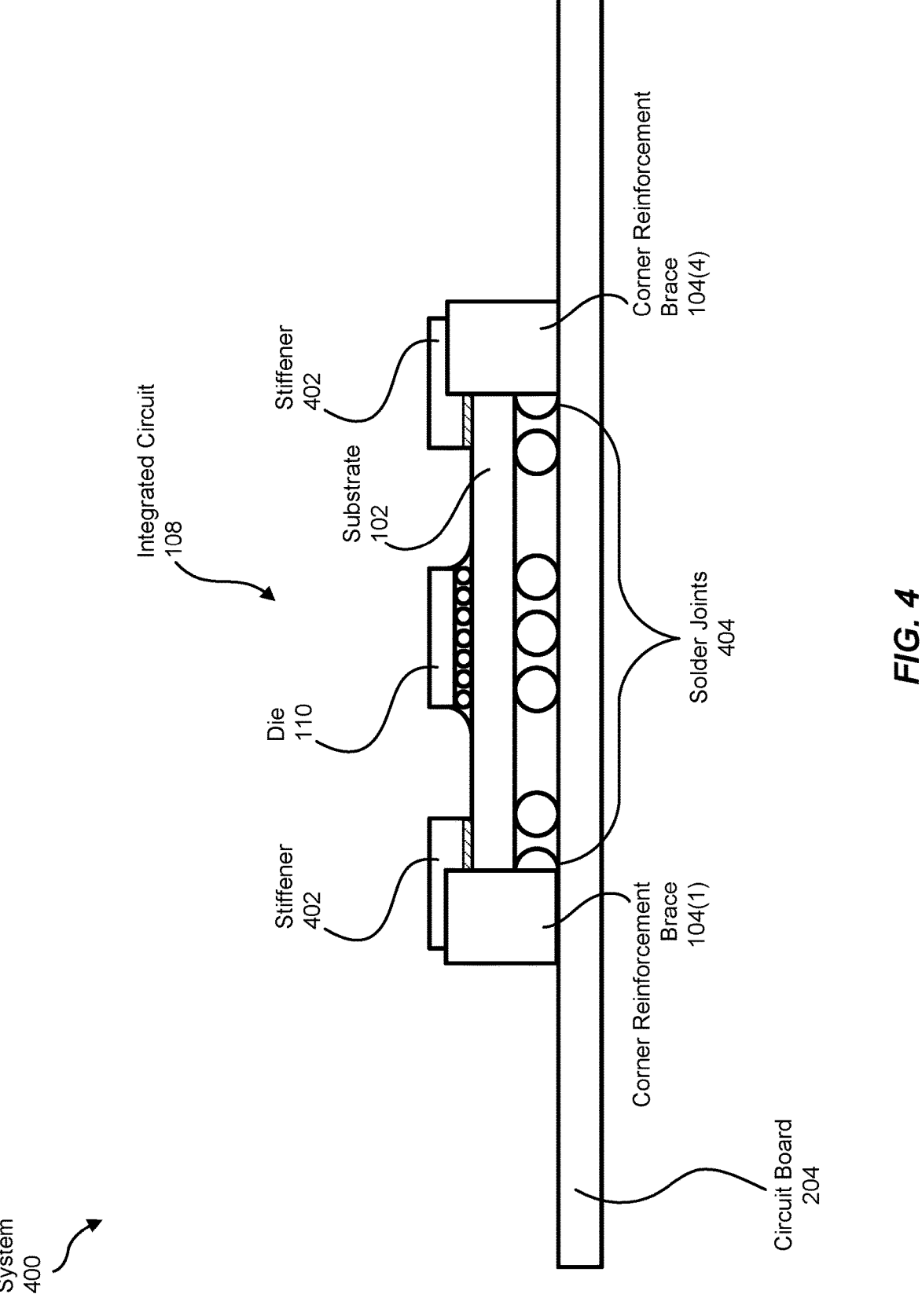
FIG. 4 is an illustration of an exemplary system for reinforcing solder joints by bracing corners of an integrated circuit substrate according to one or more embodiments of this disclosure.

FIG. 4 illustrates an exemplary system 400 for reinforcing solder joints by bracing corners of integrated circuit substrates. In some examples, system 400 may include and/or represent certain components, devices, configurations, and/or features that perform and/or provide functionalities that are similar and/or identical to those described above in connection with any of FIGS. 1-3. As illustrated in FIG. 4, exemplary system 400 may include and/or represent integrated circuit 108 soldered, mounted, and/or electrically coupled to circuit board 204. In one example, solder joints

404 may be formed and/or created between substrate 102 and circuit board 204. Additionally or alternatively, a stiffener 402 may be applied and/or coupled to substrate 102 around at least one of die 110.

In some examples, stiffener 402 may include and/or represent a ring that is adhered and/or fixed to substrate 102. In one example, stiffener 402 may fully or partially surround die 110 coupled and/or secured to substrate 102.

In some examples, stiffener 402 may include and/or represent any type or form of physical material, structure, and/or support feature that fastens, couples, and/or adheres to a surface of a substrate. Stiffener 402 may take and/or form any suitable shape. In one example, stiffener 402 may form a ring, a square, a circle, and/or a rectangle.

In addition, stiffener 402 may be of any suitable dimensions. In one example, stiffener 402 may encompass and/or follow the perimeter of the package of integrated circuit 108. In another example, stiffener 402 may encompass and/or follow the outer perimeter of the substrate 102. In a further example, stiffener 402 may encompass and/or follow the outline of the die(s) within and/or incorporated into integrated circuit 108.

Stiffener 402 may include and/or contain any various materials. Examples of such materials include, without limitation, plastics, ceramics, polymers, metals, composites, combinations or variations of one or more of the same, and/or any other suitable materials.

In some examples, stiffener 402 may serve as a foundation and/or base for a removable lid, which provides structural support, tension, and/or integrity to substrate 102 and/or integrated circuit 108. For example, stiffener 402 may be applied to the top surface or bottom surface of substrate 102 to provide such support, tension, and/or integrity to substrate 102 and/or integrated circuit 108. In one example, stiffener 402 may, on its own, provide some structural support, tension, and/or integrity to substrate 102 and/or integrated circuit 108. In this example, the application and/or installation of a removable lid to stiffener 402 may add to, increase, and/or supplement the structural support, tension, and/or integrity provided by stiffener 402 (e.g., during the reflow process).

Figure 5:
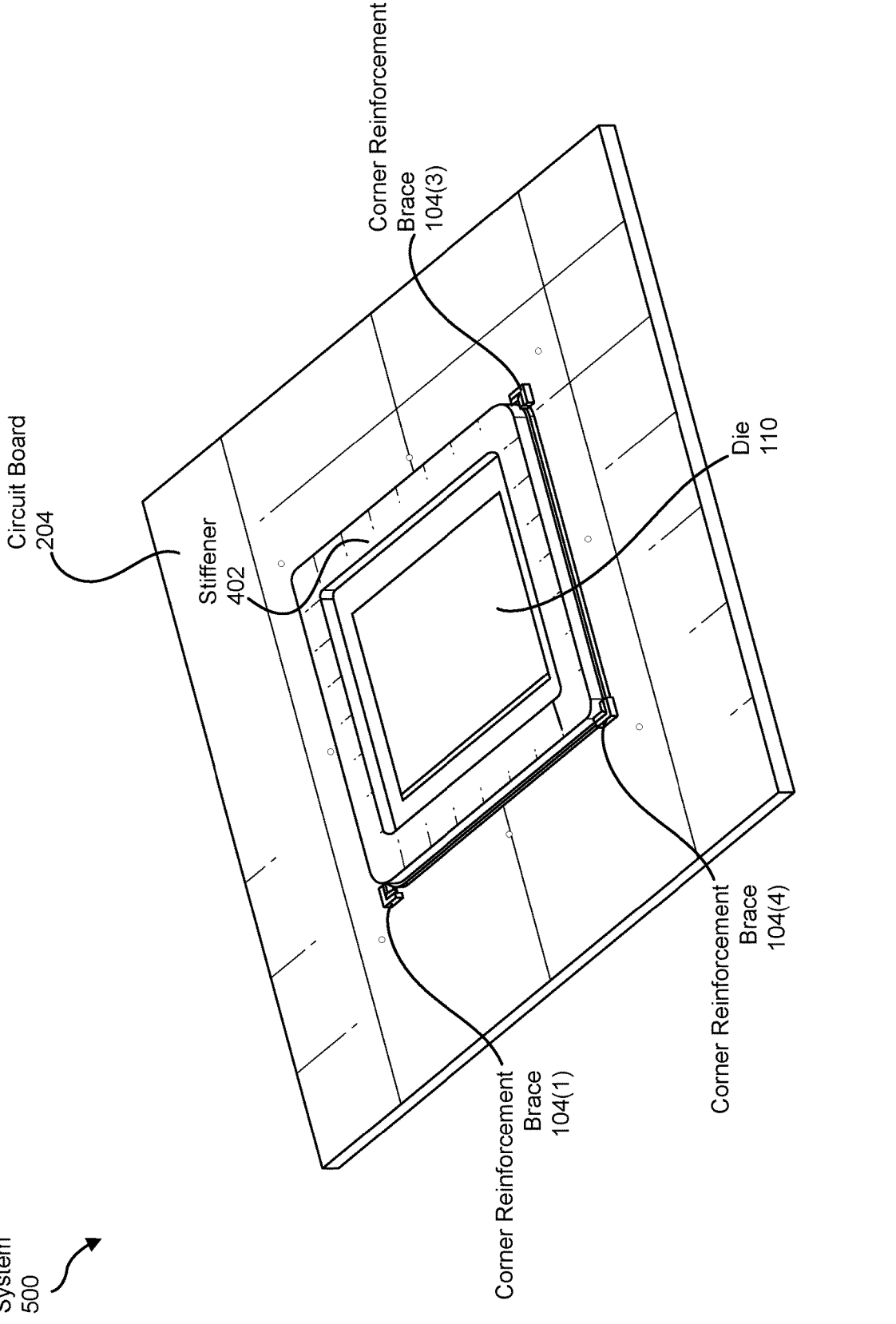
FIG. 5 is an illustration of an exemplary system for reinforcing solder joints by bracing corners of an integrated circuit substrate according to one or more embodiments of this disclosure.

FIG. 5 illustrates an exemplary system 500 for reinforcing solder joints by bracing corners of integrated circuit substrates. In some examples, system 500 may include and/or represent certain components, devices, configurations, and/or features that perform and/or provide functionalities that are similar and/or identical to those described above in connection with any of FIGS. 1-4. As illustrated in FIG. 5, exemplary system 500 may include and/or represent integrated circuit 108, corner reinforcement braces 104(1)-(4), and circuit board 204. In one example, integrated circuit 108 may include and/or represent die 110 mounted on and/or coupled to substrate 102. Additionally or alternatively, circuit board 204 may include and/or represent contact pads 208 to which integrated circuit 108 is soldered and/or electrically coupled.

Figure 6:
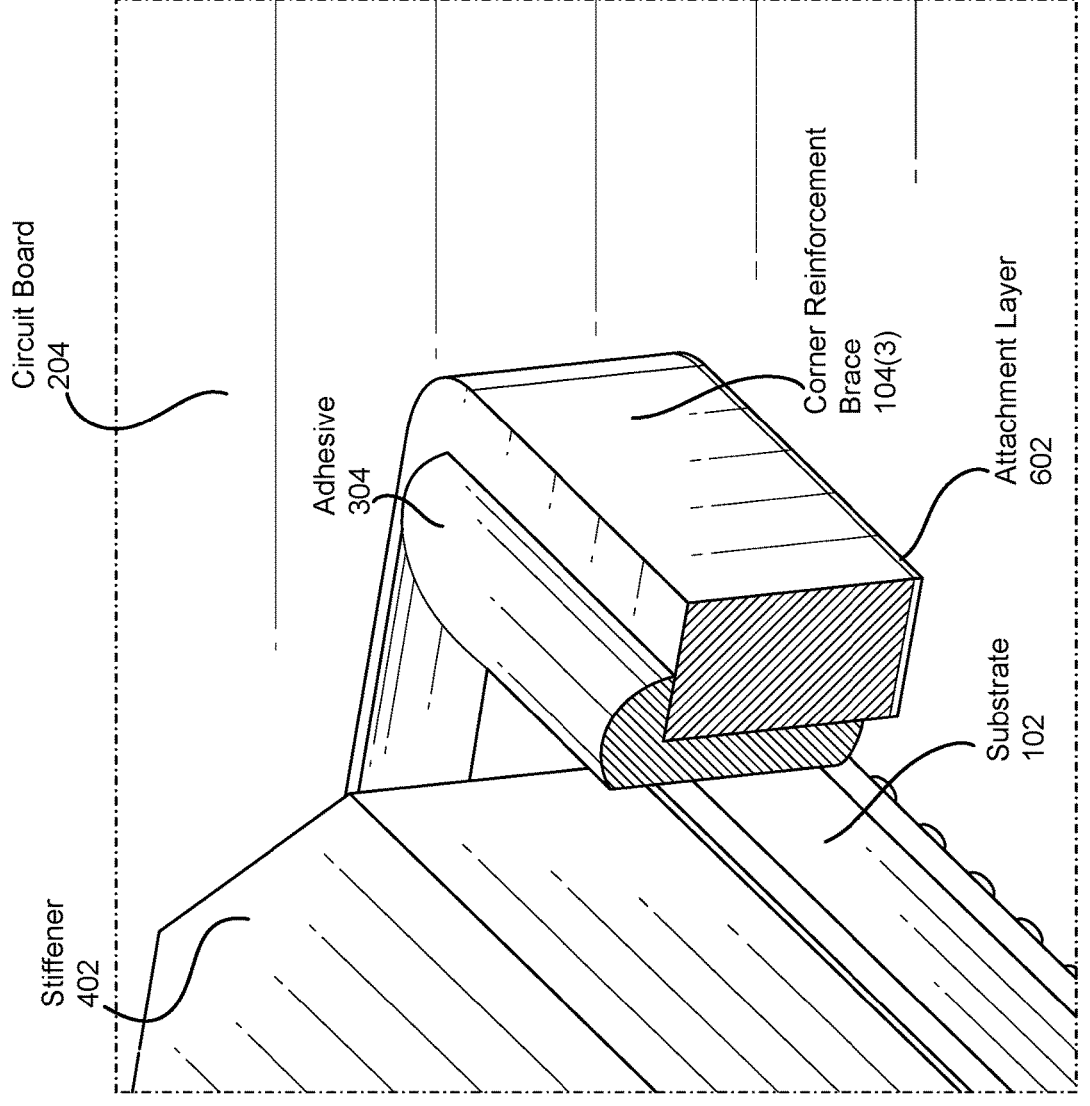
FIG. 6 is an illustration of an exemplary implementation of an apparatus for reinforcing solder joints by bracing corners of an integrated circuit substrate according to one or more embodiments.

FIG. 6 illustrates an exemplary implementation 600 for reinforcing solder joints by bracing corners of integrated circuit substrates. In some examples, implementation 600 may include and/or represent certain components, devices, configurations, and/or features that perform and/or provide functionalities that are similar and/or identical to those described above in connection with any of FIGS. 1-5. As illustrated in FIG. 6, exemplary implementation 600 may include and/or represent corner reinforcement brace 104(3) applied to a corner of substrate 102 atop circuit board 204. In one example, corner reinforcement brace 104(3) in FIG.

Figure 8:
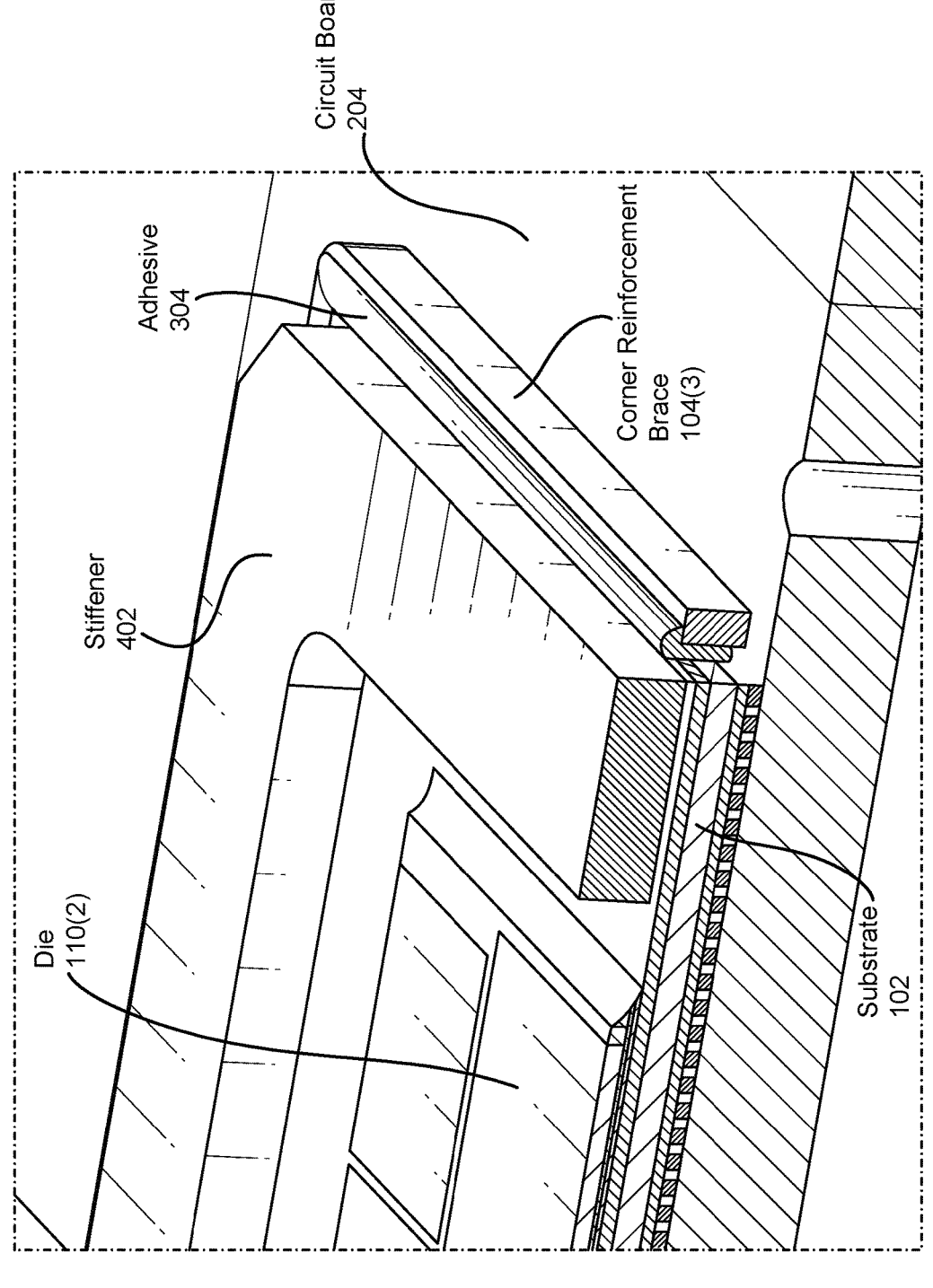
FIG. 8 is an illustration of an exemplary implementation of an apparatus for reinforcing solder joints by bracing corners of an integrated circuit substrate according to one or more embodiments.

6 may be much shorter and/or smaller (e.g., approximately five (5) millimeters in total length and/or size) than the one illustrated in FIG. 8.

In some examples, corner reinforcement brace 104(3) may be positioned and/or placed atop an attachment layer 602 proximate to the corners and/or sides of substrate 102 during a pick-and-place process or operation. In such examples, attachment layer 602 may couple, secure, and/or fix corner reinforcement brace 104(3) to circuit board 204. In one example, attachment layer 602 may cure and/or solidify during a reflow process and/or operation. Examples of attachment layer 602 include, without limitation, solder pads, solder paste, adhesives, epoxies, glues, silicones, combinations or variations of one or more of the same, and/or any other suitable attachment layer.

In one example, adhesive 304 may couple corner reinforcement brace 104(3) to the corner of substrate 102. In this example, adhesive 304 may make contact with and/or bond the corner of substrate 102, circuit board 204, and corner reinforcement brace 104(3). Additionally or alternatively, adhesive 304 may fill the gap between corner reinforcement brace 104(3) and substrate 102. Adhesive 304 may also provide similar and/or identical functionalities for any of the other corner reinforcement braces and/or corners of substate 102 described above in connection with FIGS. 1-5.

Figure 7:
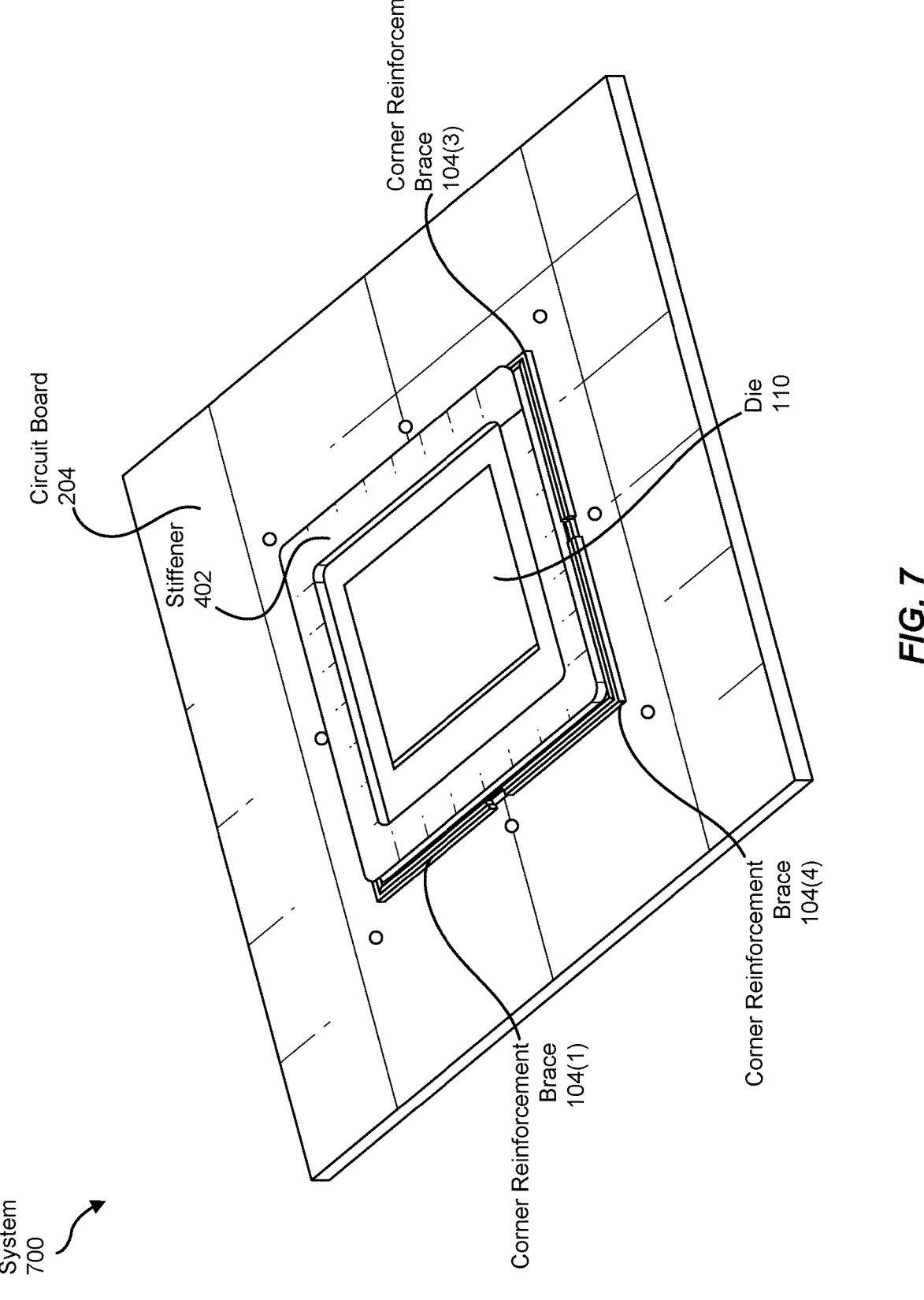
FIG. 7 is an illustration of an exemplary system for reinforcing solder joints by bracing corners of an integrated circuit substrate according to one or more embodiments of this disclosure.

FIG. 7 illustrates an exemplary system 700 for reinforcing solder joints by bracing corners of integrated circuit substrates. In some examples, system 700 may include and/or represent certain components, devices, configurations, and/or features that perform and/or provide functionalities that are similar and/or identical to those described above in connection with any of FIGS. 1-6. As illustrated in FIG. 7, exemplary system 700 may include and/or represent integrated circuit 108, corner reinforcement braces 104(1)-(4), and circuit board 204. In one example, integrated circuit 108 may include and/or represent die 110 mounted on and/or coupled to substrate 102. Additionally or alternatively, circuit board 204 may include and/or represent contact pads 208 to which integrated circuit 108 is soldered and/or electrically coupled.

FIG. 8 illustrates an exemplary implementation 800 for reinforcing solder joints by bracing corners of integrated circuit substrates. In some examples, implementation 800 may include and/or represent certain components, devices, configurations, and/or features that perform and/or provide functionalities that are similar and/or identical to those described above in connection with any of FIGS. 1-7. As illustrated in FIG. 8, exemplary implementation 800 may include and/or represent corner reinforcement brace 104(3) applied to a corner of substrate 102 atop circuit board 204. In one example, corner reinforcement brace 104(3) in FIG. 8 may be much longer and/or bigger (e.g., approximately fifty (50) millimeters in total length and/or size) than the one illustrated in FIG. 6.

In some examples, corner reinforcement braces 104(1)-(4) may be collectively positioned and/or placed to apply pressure and/or force to the corners and/or sides of substrate 102. In one example, corner reinforcement braces 104(1)-(4) may be positioned and/or placed atop attachment layers proximate to the corners and/or sides of substrate 102 during a pick-and-place process or operation. In certain implementations, corner reinforcement braces 104(1)-(4) may be placed and/or positioned atop solder pads on circuit board 204 by a pick-and-place machine and then may be soldered to those pads by a reflow device, thereby fixing corner reinforcement braces 104(1)-(4) in place. In other implementations, corner reinforcement braces 104(1)-(4) may be placed and/or positioned atop an adhesive applied in designated spots or areas on circuit board 204, thereby fixing corner reinforcement braces 104(1)-(4) in place.

In some examples, after corner reinforcement braces 104(1)-(4) have been fixed proximate to the corners of substrate 102, adhesive 304 may fill and/or be dispensed in the gaps between corner reinforcement braces 104(1)-(4) and substrate 102. In one example, upon curing and/or solidifying, adhesive 304 may couple and/or secure the corners of substrate 102, circuit board 204, and corner reinforcement braces 104(1)-(4) together.

In some examples, the various apparatuses, devices, and/or systems described in connection with FIGS. 1-8 may include and/or represent one or more additional circuits, components, and/or features that are not necessarily illustrated and/or labeled in FIGS. 1-8. For example, system 200 in FIG. 2 may also include and/or represent additional analog and/or digital circuitry, onboard logic, transistors, antennas, resistors, capacitors, diodes, inductors, switches, registers, flipflops, connections, traces, buses, semiconductor (e.g., silicon) devices and/or structures, processing devices, storage devices, circuit boards, packages, substrates, housings, attachment mechanisms, combinations or variations of one or more of the same, and/or any other suitable components.

Figure 9:
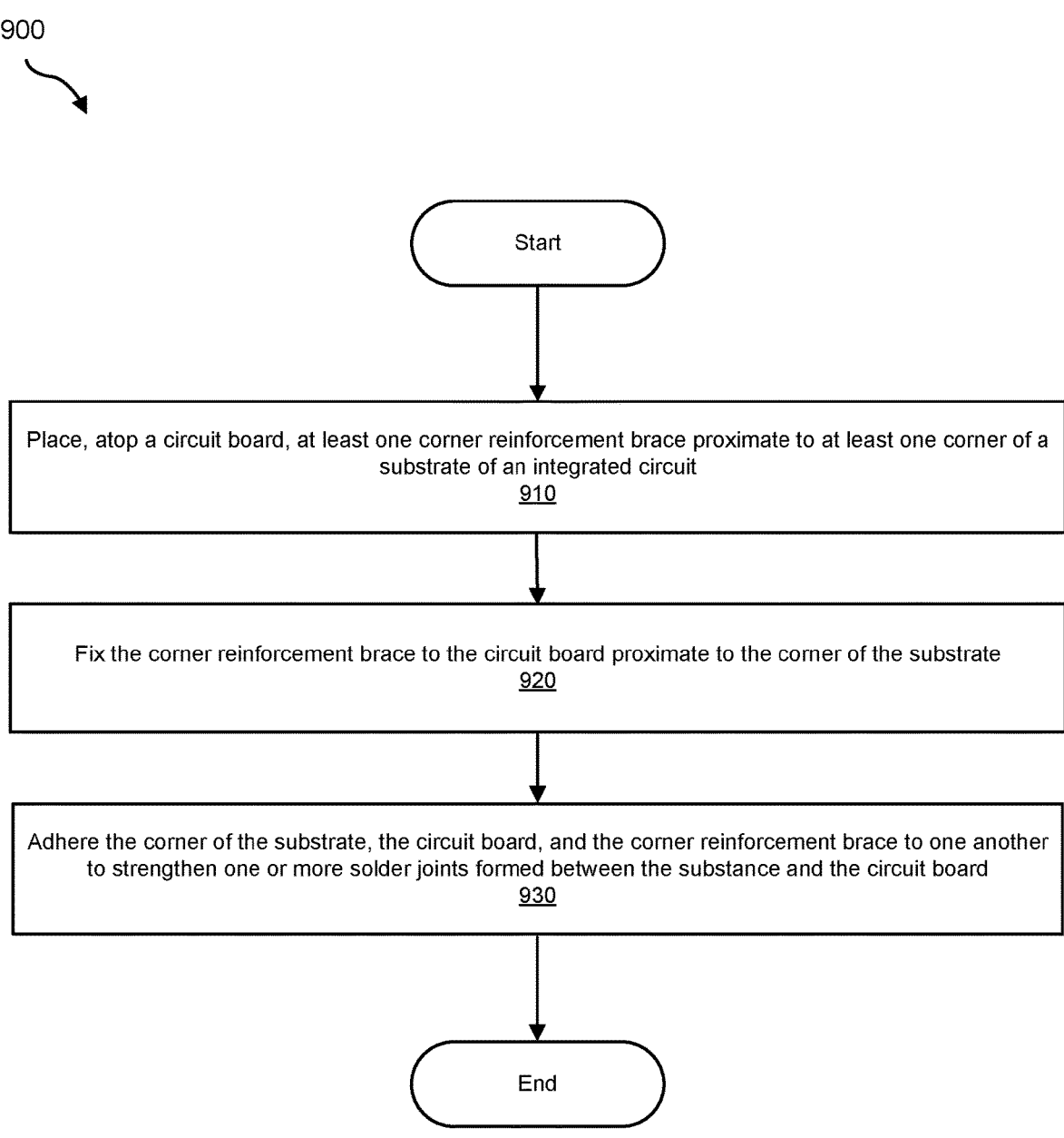
FIG. 9 is a flow diagram of an exemplary method for reinforcing solder joints by bracing corners of an integrated circuit substrate according to one or more embodiments.

FIG. 9 is a flow diagram of an exemplary method 900 for reinforcing solder joints by bracing corners of integrated circuit substrates. In one example, the steps shown in FIG. 9 may be performed by one or more automated machines (e.g., pick-and-place systems, reflow devices, etc.) and/or human technicians. Additionally or alternatively, the steps shown in FIG. 9 may incorporate and/or involve certain sub-steps and/or variations consistent with the descriptions provided above in connection with FIGS. 1-8.

As illustrated in FIG. 9, method 900 may include and/or involve the step of placing, atop a circuit board, at least one corner reinforcement brace proximate to at least one corner of a substrate of an integrated circuit (910). Step 910 may be performed in a variety of ways, including any of those described above in connection with FIGS. 1-8. For example, an integrated circuit manufacturer and/or a computing equipment manufacturer or vendor may place and/or position, atop a circuit board, at least one corner reinforcement brace proximate to at least one corner of a substrate of an integrated circuit.

Method 900 may also include and/or involve the step of fixing the corner reinforcement brace to the circuit board proximate to the corner of the substrate (920). Step 920 may be performed in a variety of ways, including any of those described above in connection with FIGS. 1-8. For example, the integrated circuit manufacturer and/or a computing equipment manufacturer or vendor may fix and/or secure the corner reinforcement brace to the circuit board proximate to the corner of the substrate.

Method 900 may further include and/or involve the step of adhering the corner of the substrate, the circuit board, and the corner reinforcement brace to one another to strengthen one or more solder joints formed between the substrate and the circuit board (930). Step 930 may be performed in a variety of ways, including any of those described above in connection with FIGS. 1-8. For example, the integrated circuit manufacturer and/or a computing equipment manufacturer or vendor may adhere and/or bond the corner of the substrate, the circuit board, and the corner reinforcement brace to one another to strengthen one or more solder joints formed between the substrate and the circuit board.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a substrate of an integrated circuit coupled to a circuit board;
at least one corner reinforcement brace that is soldered to the circuit board via a reflow process and is coupled to at least one corner of the substrate; and
a single mass of adhesive that:
couples the corner of the substrate, the circuit board, and the corner reinforcement brace to one another;
makes contact with the corner of the substrate, the circuit board, and the corner reinforcement brace; and
fills a gap between the corner reinforcement brace and the corner of the substrate, wherein the gap measures between 0.1 millimeter and 5 millimeters.

2. The apparatus of claim 1, wherein the adhesive comprises an epoxy.

3. The apparatus of claim 1, wherein the corner reinforcement brace comprises copper material.

4. The apparatus of claim 1, wherein the corner reinforcement brace comprises an L-shaped brace dimensioned to contour the corner of the substrate.

5. The apparatus of claim 1, wherein the corner reinforcement brace comprises a plurality of corner reinforcement braces collectively positioned to apply pressure to a plurality of corners of the substrate.

6. The apparatus of claim 1, wherein the corner reinforcement brace comprises two segments that join one another at a right angle.

7. The apparatus of claim 6, wherein the two segments of the corner reinforcement brace collectively span less than ten millimeters.

8. The apparatus of claim 1, wherein the corner reinforcement brace is placed atop the circuit board proximate to the corner of the substrate during a pick-and-place process.

9. A method comprising:

placing, atop a circuit board, at least one corner reinforcement brace proximate to at least one corner of a substrate of an integrated circuit;

soldering the corner reinforcement brace to the circuit board proximate to the corner of the substrate via a reflow process; and adhering, with a single mass of adhesive, the corner of the substrate, the circuit board, and the corner reinforcement brace to one another to strengthen one or more solder joints formed between the substrate and the circuit board, wherein the single mass of adhesive fills a gap between the corner reinforcement brace and the corner of the substrate and makes contact with the corner of the substrate, the circuit board, and the corner reinforcement brace.

10. The method of claim 9, wherein the adhesive comprises an epoxy.

11. The method of claim 9, wherein the corner reinforcement brace comprises copper material.

12. The method of claim 9, wherein placing the corner reinforcement brace atop the circuit board comprises placing the corner reinforcement brace atop the circuit board via a pick-and-place machine.

13. The method of claim 9, wherein the corner reinforcement brace comprises a plurality of corner reinforcement braces collectively positioned to apply pressure to a plurality of corners of the substrate.

14. A system comprising:

a circuit board;

a substrate of an integrated circuit coupled to the circuit board; and a plurality of reinforcement braces that are soldered to the circuit board via a reflow process and are coupled to a plurality of corners of the substrate; and a single mass of adhesive that:

couples one corner of the substrate, the circuit board, and one reinforcement brace to one another;

makes contact with the one corner of the substrate, the circuit board, and the one corner reinforcement brace; and fills a gap between the one reinforcement brace and the one corner of the substrate.

\* \* \* \* \*